United States Patent
Liu et al.

(10) Patent No.: US 6,297,480 B1
(45) Date of Patent: Oct. 2, 2001

(54) METHOD AND APPARATUS FOR PREVENTING CONTAMINATION IN A HOT PLATE OVEN

(75) Inventors: Liang Huang Liu, Miaoli; Shu Shing Lin, Tainan, both of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/746,273

(22) Filed: Dec. 22, 2000

(51) Int. Cl.[7] .................................................... F27D 11/00
(52) U.S. Cl. ...................... 219/388; 219/444.1; 219/390; 118/724; 118/50.1; 392/416
(58) Field of Search ..................................... 219/390, 405, 219/411, 388, 444.1; 118/724, 725, 50.1; 392/416, 418

(56) References Cited

U.S. PATENT DOCUMENTS

| | | | |
|---|---|---|---|
| 4,526,670 | * 7/1985 | Hajj | 204/298 |
| 5,449,883 | * 9/1995 | Tsuruta | 219/483 |
| 5,770,835 | * 6/1998 | Sakuyama et al. | 219/388 |
| 5,980,194 | * 11/1999 | Freerks et al. | 414/754 |
| 6,024,393 | * 2/2000 | Shamlou et al. | 294/64.1 |
| 6,228,171 | * 5/2001 | Shirakawa | 118/666 |

* cited by examiner

Primary Examiner—Teresa Walberg
Assistant Examiner—Shawntina T. Fuqua
(74) Attorney, Agent, or Firm—Tung & Associates

(57) ABSTRACT

A method and an apparatus for preventing particle contamination in a hot plate oven for curing a coating layer on a wafer surface are disclosed. The apparatus of a hot plate oven for curing a coating layer on the wafer without particle contamination can be constructed with an oven body of elongated shape; a plurality of metal heating blocks situated in the oven body arranged in a matrix form with a preset spacing there in-between; a pair of metal wafer carrying blades positioned in preset spacing between the plurality of metal heating blocks for moving both in a longitudinal direction of the oven body to traverse a wafer and in a vertical direction to load or unload the wafer from a planar top surface of the metal heating blocks; and an interlocking circuit for detecting an electrical short between any one of the pair of metal wafer carrying blades and any one of the plurality of metal heating blocks and for stopping the movement of the pair of metal wafer carrying blades when such electrical short is detected.

20 Claims, 2 Drawing Sheets

METHOD AND APPARATUS FOR PREVENTING CONTAMINATION IN A HOT PLATE OVEN

FIELD OF THE INVENTION

The present invention generally relates to a method and an apparatus for preventing contamination in a hotplate oven and more particularly, relates to a method and apparatus for preventing particle contamination in a hotplate oven that is equipped with a pair of wafer carrying blades for traversing between a polarity of metal heating blocks capable of detecting an electrical short between the blades and the blocks and stopping the movement of the wafer carrying blades and the further generation of particle contamination.

BACKGROUND OF THE INVENTION

In semiconductor fabrication processes, a semiconducting wafer must be repeatedly coated with many different material layers and processed in physical or chemical processes before the final IC device is fabricated. One of such numerous coating processes is the coating of a spin-on-glass layer as a planarization layer on top of a semiconductor structure.

Spin-on-glass (SOG) is frequently used for gap fill and planarization of inter-level-dielectrics (ILD) in multi-level metalization structures. It is suitable for low-cost fabrication of IC circuits. Most commonly used SOG materials are of two basic types; an inorganic type of silicate based SOG and an organic type of silicon oxide based polysiloxane which is featured with radical groups replacing or attaching to oxygen atoms. Based on these two basic structures, the molecular weight, the viscosity and the desirable film properties of SOG can be modified and adjusted to suit the specific requirements of an IC fabrication process.

SOG film is typically applied to a pre-deposited oxide surface as a liquid to fill gaps and steps on the substrate. Similar to the application method for photoresist films, a SOG material can be dispensed onto a wafer and spun with a rotational speed which determines the thickness of the SOG layer desired. After the film is evenly applied to the surface of the substrate, it is cured at a temperature of up to 400° C. and then etched back to obtain a smooth surface in preparation for a capping oxide layer on which a second interlevel metal may be patterned. The purpose of the etch-back step is to leave SOG between metal lines but not on top of the metal, while the capping oxide layer is used to seal and protect SOG during further fabrication processes. The siloxane based SOG material is capable of filling 0.15 micron gaps and therefore it can be used in 0.25 micron technology.

When fully cured, silicate SOG has similar properties like those of silicon dioxide. Silicate SOG does not absorb water in significant quantity and is thermally stable. However, one disadvantage of silicate SOG is the large volume shrinkage during curing. As a result, the silicate SOG retains high stress and cracks easily during curing and further handling. The cracking of the SOG layer can cause a serious contamination problem for the fabrication process. The problem can sometimes be avoided by the application of only a thin layer, i.e., 1000~2000Å of the silicate SOG material.

The curing of the SOG coating layer is frequently conducted in the same apparatus that spin-coats the material. The close proximity of the curing apparatus to the coating apparatus becomes a necessity when a thick SOG layer must be coated for a specific purpose, for instance, as a planarization layer. When a thick SOG coating is required, the material must be coated in multiple passes on the wafer and after each thin layer coating, the coating must be cured before the next layer of SOG may be added on top. It is therefore desirable to design an apparatus wherein the wafer may be coated with a thin SOG layer, then cured in a curing station, before it returns to the coating station for the next layer coating process.

A conventional SOG curing apparatus, that is used in conjunction with a coating apparatus in close proximity, is shown in FIG. 1. The curing apparatus 10 is constructed with an oven body 12 and a cover 14 for forming an enclosure, or a cavity 16 therein. The oven body 12 is normally formed in an elongated shape with an open top and a cavity 16 defined by two side panels 18,20, two end panels 22,24 and a bottom panel 26. The two end panels 22, 24 each has slot openings 30 provided therein for a pair of wafer carrying blades 32, 34 to pass therethrough.

The oven body 12 further includes a plurality of metal heating blocks 36 (or hot plates) situated in the cavity 16 arranged in a matrix form with a preset spacing 38 therein-between. The present spacing 38 in the longitudinal direction is smaller than that in the transverse direction such that the pair of wafer carrying blades 32, 34 fit snugly therein. The smaller spacing 38 in the longitudinal direction is necessary such that, as shown in FIG. 1, three separate metal heating blocks form a single heat station with a minimal space therein-between. As shown in FIG. 1, B1, B2 and B3 are three separate heating stations each formed by three metal heating blocks 36. A nitrogen purge gas is flown into the oven body 12 through a vent outlet 40 to improve the heat distribution in the cavity 16 when the cover 14 is closed on the oven body 12. The purge gas of nitrogen exits the cavity 16 through a bottom portion of the oven body 12, i.e., through a vent outlet 42.

A plain view of the multiplicity of heating blocks 36, a pair of wafer carrying blades, 32, 34 (known as walking beam in the industry) which are guided by two pairs of rollers 44 are shown in FIG. 2. Within each heating station of B1, B2 or B3, the preset spacing 38 between the heating blocks 36 is kept at a minimum such that a uniform temperature of the surface of the heating blocks 36 within the heating station can be achieved. The preset spacing 38 is therefore maintained at a very small value, such as between about 3 mm and about 5 mm which is the distance between the wafer carrying blade 32 and the heating block 36.

A processing difficulty frequently arises due to the small preset spacing 38 utilized in the SOG curing apparatus 10. Since both the heating blocks 36 and the wafer carrying blades 32, 34 are fabricated of a metal such as aluminum, when the preset spacing is not kept, friction occurs when the carrying blades 32, 34 touch the heating blocks 36. The mechanical friction between the two metal parts generates metal particles, i.e. aluminum particles, that can be a serious contamination source to the wafer that is being processed in the curing apparatus 10.

It is therefore an object of the present invention to provide a hot plate oven that can be used for curing a wafer coating layer without the particle contamination problem occurring in a conventional curing apparatus.

It is another object of the present invention to provide a hot plate oven for curing a coating layer on a wafer without particle contamination wherein the oven consists of a pair of wafer carrying blades that move in-between a plurality of metal heating blocks.

It is a further object of the present invention to provide a hot plate oven for curing a coating layer on a wafer without generating particle contamination which is equipped with an interlock circuit for shutting down the wafer transporting function in the oven when any touching between the wafer carrying blades and the heating blocks is detected.

It is another further object of the present invention to provide a hot plate oven for curing a coating layer on a wafer without generating particle contamination by providing an interlocking circuit which detects an electrical short between the wafer carrying blades and the metal heating blocks and thereby shutting down the curing process.

It is still another object of the present invention to provide a method for preventing particle contamination in a hot plate oven for curing a wafer coating layer by incorporating an interlock circuit for shutting down the curing operation when a contact between a wafer carrying blade and a metal heating block is detected.

It is yet another object of the present invention to provide a hot plate oven for curing a coating layer on a wafer without generating particle contamination which consists of an interlocking circuit formed by a solid state relay, a resistor, a relay, a reset switch and a buzzer alarm.

SUMMARY OF THE INVENTION

In accordance with the present invention, a method and an apparatus for preventing particle contamination in a hot plate oven for curing a wafer coating layer are provided.

In a preferred embodiment, a method for preventing particle contamination in a hot plate oven for curing a wafer coating layer can be carried out by the operating steps of providing a hot plate oven including a plurality of metal heating blocks with a pair of wafer carrying blades positioned therein-between; heating the plurality of metal heating blocks to a temperature of at least 80° C.; positioning a wafer that has a coating layer on top of the pair of wafer carrying blades; advancing the pair of wafer carrying blades such that the coating layer of the wafer is cured by the plurality of metal heating blocks; and detecting an electrical short between one of the pair of wafer carrying blades and one of the plurality of metal heating blocks and stopping the advancement of the pair of wafer carrying blades.

The method for preventing particle contamination in a hot plate oven for curing a wafer coating layer may further include the step, after the detecting step for an electrical short, of activating an alarm. The method may further include the step of providing the plurality of metal heating blocks in at least two heating stations each heated to a temperature that is different than the other, or the step of providing the plurality of metal heating blocks in three stations each heated to a different temperature within a temperature range between about 80° C. and about 300° C. The method may further include the step of positioning the pair of wafer carrying blades in-between the plurality of metal heating blocks such that the blades are spaced-apart from the metal heating blocks by a distance of at least 3 mm. The method may further include the step of dividing the plurality of metal heating blocks into three stations and heating a first station to about 100° C., heating a second station to about 160° C., and heating a third station to about 250° C.

The method for preventing particle contamination in a hot plate oven for curing a coating layer on a wafer may further include the step of positioning a wafer that has a spin-on-glass coating layer on top of the pair of wafer carrying blades. The method may further include the step of providing an interlock circuit for detecting an electrical short between one of the pair of wafer carrying blades and one of the plurality of metal heating blocks. The method may further include the step of forming the interlock circuit by a solid state relay, a resistor, a relay, a reset switch, and a buzzer alarm. The method may further include the step of including a DC power supply to the interlock circuit. The method may further include a step of enclosing the plurality of metal heating blocks and the pair of wafer carrying blades in an enclosure and controlling the temperature of the plurality of metal heating blocks to within ±10° C., or the step of enclosing the plurality of metal heating blocks and the pair of wafer carrying blades in an enclosure and purging an inert gas through the enclosure for carrying away impurities.

The present invention is further directed to a hot plate oven for curing a coating layer on a wafer without particle contamination problems which consists of an oven body of elongated shape that has an open top and a cavity defined by two side panels, two end panels and a bottom panel. The two end panels each has slot openings therein for a pair of wafer carrying blades to pass therethrough; a plurality of metal heating blocks situated in the oven body arranged in a matrix form with a preset spacing there in-between, the plurality of metal heating blocks has a planar top surface adapted for intimately engaging a wafer positioned thereon; a pair of metal wafer carrying blades positioned in a preset spacing between the plurality of metal heating blocks adapted to move both in a longitudinal direction of the oven body to traverse a wafer and in a vertical direction to load or unload the wafer from the planar top surface of the plurality of metal heating blocks; and an interlocking circuit for detecting an electrical short between the pair of metal wafer carrying blades and the plurality of metal heating blocks and for stopping the movement of the pair of metal wafer carrying blades.

The hot plate oven for curing a coating layer of a wafer without particle contamination problem, may further include a lid for covering the oven body forming an enclosure therein-between, or an inert gas purging through the oven body during a curing process. The plurality of metal heating blocks may be divided into at least two heating stations for maintaining at least two different temperature zones in the oven body, or divided into three heating stations for maintaining three different temperature zones in the range between about 80° C. and 300° C. in the oven body. The pair of metal wafer carrying blades and the plurality of metal heating blocks may be fabricated of aluminum. The interlocking circuit may further include a solid state relay, a resistor, a relay, a reset switch and a buzzer alarm. The plurality of metal heating blocks may be formed into three heating stations each being preset at about 100° C., at about 160° C, and at about 250° C., respectively.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
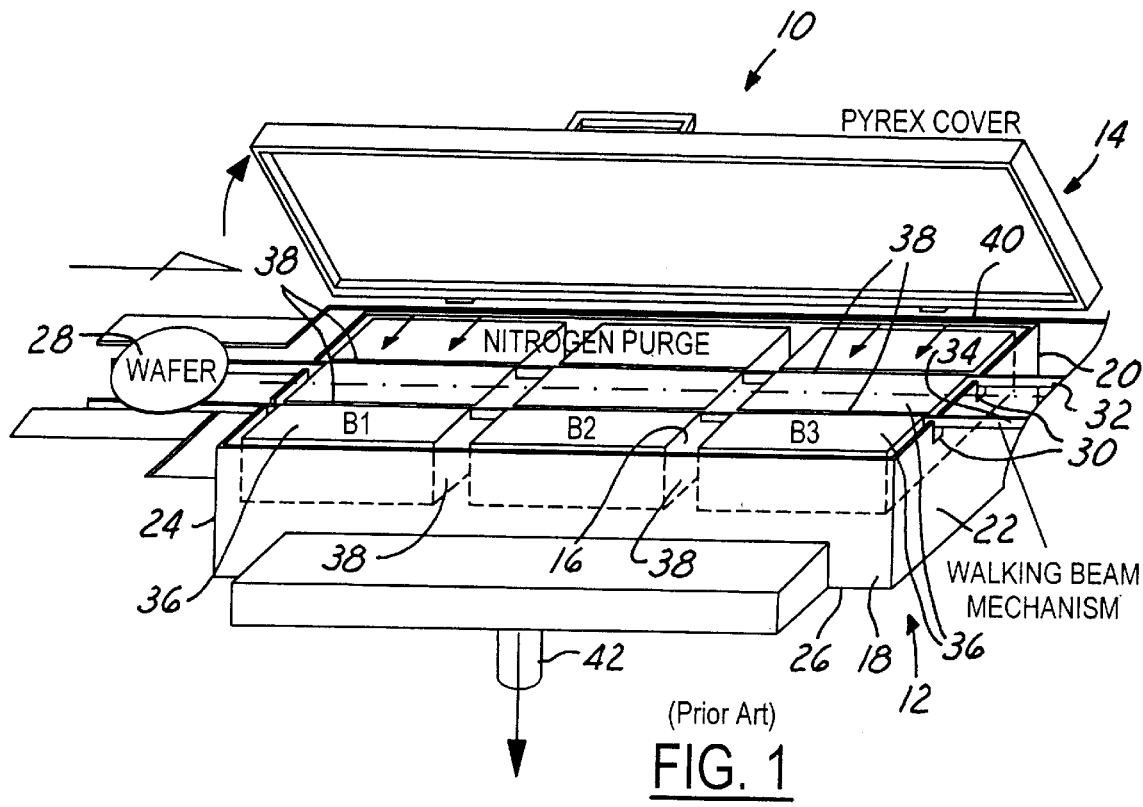
FIG. 1 is a prospective view of a conventional hot plate curing oven equipped with a plurality of metal heating blocks and a pair of wafer carrying blades.
Figure 2:
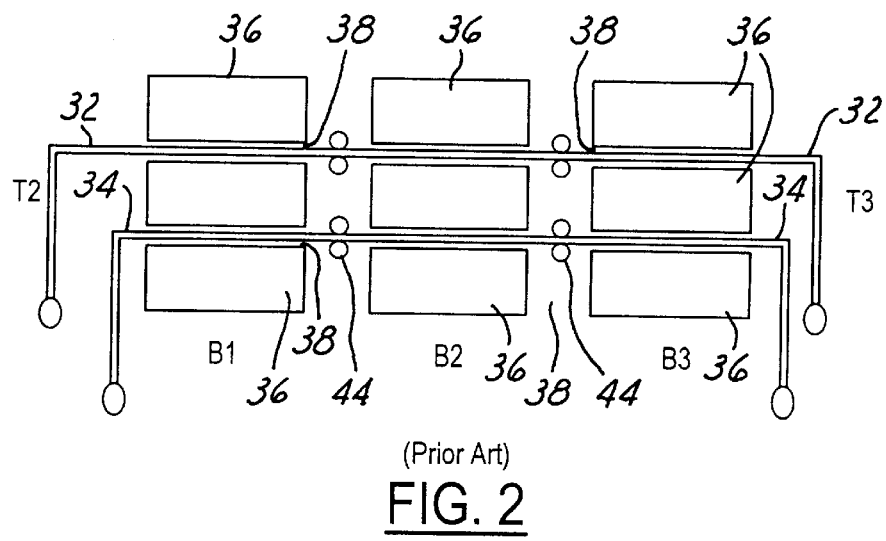
FIG. 2 is a plain view of the metal heating blocks and the pair of wafer carrying blades shown in FIG. 1.

The present invention discloses a method and an apparatus for preventing particle contamination in a hot plate oven for curing a coating layer on a wafer surface. In the method, a hot plate oven is first provided which includes a plurality of metal heating blocks with a pair of wafer carrying blades positioned in-between the heating blocks; heating the plurality of metal heating blocks to a temperature between about 80° C. and about 300° C. wherein the heating blocks are divided into multiple heating zones;

positioning a wafer that has a coating layer such as spin-on-glass on top of the pair of wafer carrying blades; advancing the pair of wafer carrying blades such that the coating layer on the wafer is cured by the multiple heating zones formed by the plurality of metal heating blocks; and detecting an electrical short between at least one of the pair of wafer carrying blades and at least one of the plurality of metal heating blocks and stopping the advancement of the pair of wafer carrying blades. The method may further include the step of sounding an alarm or activating a warning light when the electrical short is detected.

The invention further discloses a hot plate oven for curing a coating layer on a wafer surface without particle contamination problem which is constructed by an oven body generally of an elongated shape with an open top an a cavity formed by two side panels, two end panels and a bottom panel. A plurality of slot openings is provided in the two end panels for a pair of wafer carrying plates to pass therethrough. The oven body further includes a plurality of metal heating blocks arranged in a matrix form with a preset spacing in-between the blocks. The plurality of metal heating blocks may be similarly divided into multiple heating zones, i.e. at least two or three heating zones. The heating blocks form a planar top surface adapted for intimately engaging a wafer that is positioned thereon. The oven body further includes a pair of wafer carrying blades fabricated of metal that are positioned in the preset spacing between the plurality of metal heating blocks. The wafer carrying blades move both in a longitudinal direction of the oven body to traverse a wafer and in a vertical direction to load or unload the wafer from the planar top surface formed by the heating blocks. An interlocking surface is further provided in the hot plate oven for detecting an electrical short between the pair of metal wafer carrying blades and the plurality of metal heating blocks. The interlocking circuit stops the movement of the wafer carrying blades when such electrical short is detected to prevent the generation of metal particles by the metal wafer carrying blades rubbing against the metal heating blocks.

The preset spacing between the plurality of metal heating blocks in the same heating station is maintained at a minimal such that there is no temperature gap formed of the top planar surface of the heating station. For instance, a minimal distance between about 3 mm and about 5 mm should be maintained in-between the wafer carrying blade and the metal heating blocks. The small preset spacing between the two metal members is the major contributor to the metal particle contamination problem in such a hot plate oven when the wafer carrying blade touches, or rubs against the metal heating blocks when alignment of the blade is off. By utilizing the present invention novel interlock circuit in conjunction with the hot plate oven, such particle contamination can be substantially eliminated and thus ensuring a contamination-free environment in the hot plate oven for curing SOG layer coated wafers.

Figure 3:
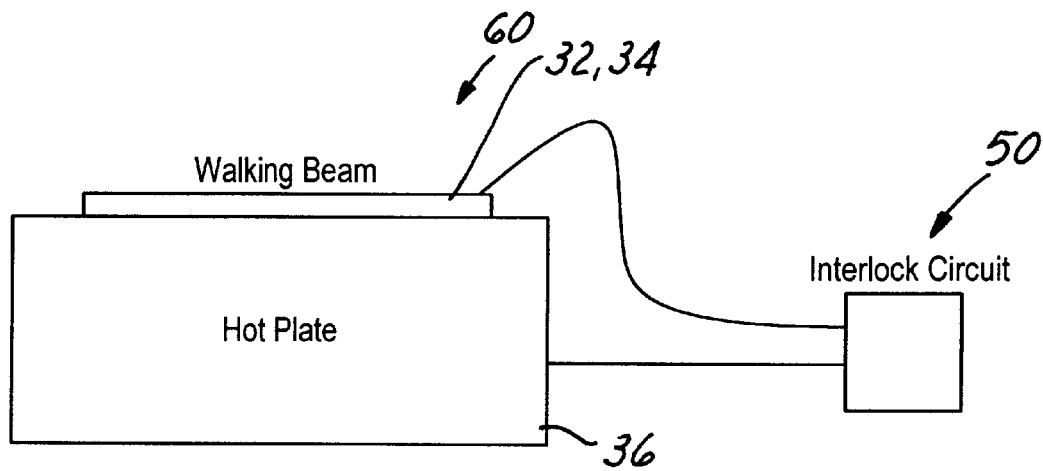
FIG. 3 is an illustration of the electrical connection of the present invention interlock circuit with the wafer carrying blades and the hot plates.

Referring now to FIG. 3, wherein electrical connections between an interlock circuit and a hot plate oven 60 is illustrated. The hot plate oven 60 is shown in a simplified manner with only the wafer carrying blades 32, 34 and the metal heating blocks 36 shown. A detailed illustration of the interlock circuit 50 is further shown in FIG. 4.

As shown in FIG. 3, the interlock circuit 50 of the present invention is connected at one end to the wafer carrying blades 32,34 (or the walking beam) while the other end is connected to the plurality of metal heating blocks 36. The plurality of metal heating blocks 36 are connected in series and therefore only one node is necessary to be connected to the interlock circuit 50.

Figure 4:
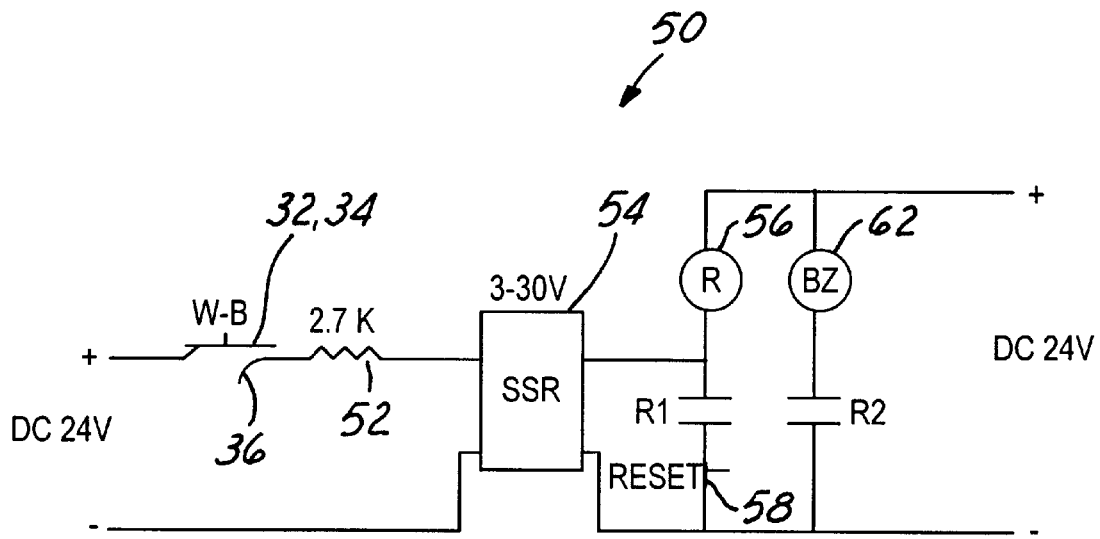
FIG. 4 is an electrical circuit illustrating the present invention interlock circuit.

A power source of 24V DC is utilized to power the present invention interlock circuit, as shown in FIG. 4. The power supply source is connected to both ends of the circuit as shown. When an electrical short is formed between the wafer carrying blades 32,34 and one of the metal heating blocks 36, a current flows through the resistor 52, the solid state relay 54 which operates in a voltage range between 3V and 30V DC, a relay 56 and a reset switch 58. As shown in FIG. 4, when a short between the wafer carrying blades 32, 34 and the metal heating block 36 is formed, electrical current of 24V DC flows into the solid state relay 54 and therefore activates the relay and causing a power supply to a motor means (not shown) for moving the wafer carrying blades 32,34 to be interrupted and, thereby stopping the motion of the blades. The detection of a short further activates the buzzer alarm 62 to alert a machine operator of the undesirable operating condition.

In a preferred embodiment, the present invention wafer carrying blades 32,34 are provided in a thickness of about 1 mm, in a height of about 10 mm, and in a length of about 75 cm. Furthermore, in the preferred embodiment, three different heating zones are provided in the oven body, i.e. a first heating zone kept at about 100° C., a second heating zone kept at about 160° C., and a third heating zone capped at about 250° C. The wafer is lifted, traversed, and then put down at each heat station for a time period of curing for about 1 minute.

The present invention novel method and apparatus for preventing particle contamination in a hot plate oven for curing a coating layer on a wafer has therefore been amply described in the above description and in the appended drawings of FIGS. 3 and 4.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows:

What is claimed is:

1. A method for preventing particle contamination in a hot plate oven for curing a wafer coating layer comprising the steps of:

providing a hot plate oven comprising a plurality of metal heating blocks with a pair of wafer carrying blades positioned therein-between;

heating said plurality of metal heating blocks to a temperature of at least 80° C.;

positioning a wafer having a coating layer on top of said pair of wafer carrying blades;

advancing said pair of wafer carrying blades such that said coating layer on said wafer is cured by said plurality of metal heating blocks; and detecting an electrical short between one of said pair of wafer carrying blades and one of said plurality of metal heating blocks and stopping said advancement of said pair of wafer carrying blades.

2. A method for preventing particle contamination in a hot plate oven for curing a wafer coating layer according to claim 1 further comprising the step, after said detecting step for an electrical short, of activating an alarm.

3. A method for preventing particle contamination in a hot plate oven for curing a wafer coating layer according to claim 1 further comprising the step of providing said plurality of metal heating blocks in at least two heating stations each heated to a temperature that is different than the other.

4. A method for preventing particle contamination in a hot plate oven for curing a wafer coating layer according to claim 1 further comprising the step of providing said plurality of metal heating blocks in three stations each heated to a different temperature within a temperature range between about 80° C. and about 300° C.

5. A method for preventing particle contamination in a hot plate oven for curing a wafer coating layer according to claim 1 further comprising the step of positioning said pair of wafer carrying blades in-between said plurality of metal heating blocks such that the blades are spaced-apart from the metal heating blocks by a distance of at least 3 mm.

6. A method for preventing particle contamination in a hot plate oven for curing a wafer coating layer according to claim 1 further comprising the step of dividing said plurality of metal heating blocks into three stations and heating a first station to about 100° C., heating a second station to about 160° C. and heating a third station to about 250° C.

7. A method for preventing particle contamination in a hot plate oven for curing a wafer coating layer according to claim 1 further comprising the step of positioning a wafer having a spin-on-glass coating layer on top of said pair of wafer carrying blades.

8. A method for preventing particle contamination in a hot plate oven for curing a wafer coating layer according to claim 1 further comprising the step of providing an interlock circuit for detecting said electrical short between one of said pair of wafer carrying blades and one of said plurality of metal heating blocks.

9. A method for preventing particle contamination in a hot plate oven for curing a wafer coating layer according to claim 8 further comprising the step of forming said interlock circuit by a solid state relay, a resistor, a relay, a reset switch and a buzzer alarm.

10. A method for preventing particle contamination in a hot plate oven for curing a wafer coating layer according to claim 8 further comprising the step of inputting a DC power supply to said interlock circuit.

11. A method for preventing particle contamination in a hot plate oven for curing a wafer coating layer according to claim 1 further comprising the step of enclosing said plurality of metal heating blocks and said pair of wafer carrying blades in an enclosure and controlling the temperature of said plurality of metal heating blocks to within ±10° C.

12. A method for preventing particle contamination in a hot plate oven for curing a wafer coating layer according to claim 1 further comprising the step of enclosing said plurality of metal heating blocks and said pair of wafer carrying blades in an enclosure and purging an inert gas through said enclosure for carrying away impurities.

13. A hot plate oven for curing a coating layer on a wafer without contamination problem comprising:

an oven body of elongated shape having an open top and a cavity defined by two side panels, two end panels and a bottom panel, said two end panels having slot openings therein for a pair of wafer carrying blades to pass therethrough;

a plurality of metal heating blocks situated in said oven body arranged in a matrix form with a preset spacing therein-between, said plurality of metal heating blocks having a planar top surface adapted for intimately engaging a wafer positioned thereon;

a pair of metal wafer carrying blades positioned in said preset spacing between said plurality of metal heating blocks adapted to move both in a longitudinal direction of said oven body to traverse a wafer and in a vertical direction to load or unload said wafer from said planar top surface of said plurality of metal heating blocks; and an interlocking circuit for detecting an electrical short between said pair of metal wafer carrying blades and said plurality of metal heating blocks and for stopping the movement of said pair of metal wafer carrying blades.

14. A hot plate oven for curing a coating layer on a wafer without contamination problem according to claim 13 further comprising a lid for covering said oven body forming an enclosure therein-between.

15. A hot plate oven for curing a coating layer on a wafer without contamination problem according to claim 13 further comprising an inert gas purging means in said oven body for purging an inert gas through said oven body during a curing process.

16. A hot plate oven for curing a coating layer on a wafer without contamination problem according to claim 13, wherein said plurality of metal heating blocks are divided into at least two heating stations for maintaining at least two different temperature zones in said oven body.

17. A hot plate oven for curing a coating layer on a wafer without contamination problem according to claim 13, wherein said plurality of metal heating blocks are divided into three heating stations for maintaining three different temperature zones in the range between about 80° C. and about 300° C. in said oven body.

18. A hot plate oven for curing a coating layer on a wafer without contamination problem according to claim 13, wherein said pair of metal wafer carrying blades and said plurality of metal heating blocks are fabricated of aluminum.

19. A hot plate oven for curing a coating layer on a wafer without contamination problem according to claim 13 wherein said interlocking circuit further comprises a solid state relay, a resistor, a relay, a reset switch and a buzzer alarm.

20. A hot plate oven for curing a coating layer on a wafer without contamination problem according to claim 13, wherein said plurality of metal heating blocks are formed into three heating stations each being preset at about 100° C., at about 160° C. and at about 250° C., respectively.

* * * * *